(12) United States Patent
Nagai

(10) Patent No.: US 7,497,213 B2
(45) Date of Patent: Mar. 3, 2009

(54) WAFER DIVIDING APPARATUS

(75) Inventor: Yusuke Nagai, Tokyo (JP)

(73) Assignee: Disco Corporation, Tokyo (JP)

( * ) Notice: Subject to any disclaimer, the term of this patent is extended or adjusted under 35 U.S.C. 154(b) by 478 days.

(21) Appl. No.: 11/249,494

(22) Filed: Oct. 14, 2005

(65) Prior Publication Data

US 2006/0081574 A1 Apr. 20, 2006

(30) Foreign Application Priority Data

Oct. 20, 2004 (JP) .............................. 2004-306041

(51) Int. Cl.
*B28D 1/32* (2006.01)
(52) U.S. Cl. ..................... 125/23.01; 269/21; 225/96.5; 225/93; 225/2; 225/1; 225/100; 29/25.01
(58) Field of Classification Search .................. 269/21; 125/23.01; 225/96.5, 93, 92, 1, 100
See application file for complete search history.

(56) References Cited

U.S. PATENT DOCUMENTS

| 7,063,083 B2 * | 6/2006 | Ohmiya et al. ........... 125/23.01 |
| 2005/0019980 A1 * | 1/2005 | Kurosawa et al. ........... 438/107 |
| 2005/0090077 A1 | 4/2005 | Nagai et al. |
| 2007/0045831 A1 * | 3/2007 | Wong et al. ................. 257/724 |
| 2007/0275543 A1 * | 11/2007 | Abe et al. ................... 438/464 |

FOREIGN PATENT DOCUMENTS

| JP | 2002192370 | 7/2002 |
| JP | 3408805 | 3/2003 |
| JP | 2005-129607 | 5/2005 |

OTHER PUBLICATIONS

U.S. Appl. No. 11/183,828, filed Jul. 19, 2005.

* cited by examiner

*Primary Examiner*—N Drew Richards
*Assistant Examiner*—Jae Lee
(74) *Attorney, Agent, or Firm*—Smith, Gambrell & Russell, LLP

(57) ABSTRACT

A wafer dividing apparatus for dividing a wafer whose strength is reduced along a plurality of dividing lines, along the dividing lines, which comprises a tape holding means for holding a protective tape affixed to one side of the wafer; and wafer dividing means, each comprising a plurality of tension application means comprising a first suction-holding member and a second suction-holding member for suction-holding the wafer held on the tape holding means through the protective tape on both sides of a dividing line, and moving means for moving the first suction-holding members and the second suction-holding members in such directions that they separate from each other.

6 Claims, 8 Drawing Sheets

(a)

(b)

WAFER DIVIDING APPARATUS

FIELD OF THE INVENTION

The present invention relates to a wafer dividing apparatus for dividing a wafer having dividing lines formed in a lattice pattern on the front surface, along the dividing lines.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a circuit such as IC or LSI is formed in each of the sectioned areas. Individual semiconductor chips are manufactured by cutting this semiconductor wafer along the dividing lines to divide it into the areas having a circuit formed thereon. Further, an optical device wafer comprising gallium nitride-based compound semiconductors laminated on the front surface of a sapphire substrate is also cut along predetermined dividing lines to be divided into individual optical devices such as light emitting diodes or laser diodes, which are widely used in electric appliances.

Cutting along the dividing lines of the above semiconductor wafer or optical device wafer is generally carried out by using a cutting machine called "dicer". This cutting machine comprises a chuck table for holding a workpiece such as a semiconductor wafer or optical device wafer, a cutting means for cutting the workpiece held on the chuck table, and a cutting-feed means for moving the chuck table and the cutting means relative to each other. The cutting means comprises a rotary spindle, a cutting blade mounted on the spindle and a drive mechanism for rotary-driving the rotary spindle. The cutting blade comprises a disk-like base and an annular cutting-edge which is mounted on the side wall outer periphery of the base and formed as thick as about 20 μm by fixing diamond abrasive grains having a diameter of about 3 μm to the base by electroforming.

Since a sapphire substrate, silicon carbide substrate, etc. have high Mohs hardness, however, cutting with the above cutting blade is not always easy. Further, as the cutting blade has a thickness of about 20 μm, the dividing lines for sectioning devices must have a width of about 50 μm. Therefore, in the case of a device measuring 300 μm×300 μm, the area ratio of the streets to the device becomes 14%, thereby reducing productivity.

Meanwhile, as a means of dividing a plate-like workpiece such as a semiconductor wafer, a laser processing method for applying a pulse laser beam of a wavelength capable of passing through the workpiece with its focusing point set to the inside of the area to be divided is also attempted nowadays, and disclosed by Japanese Patent No. 3408805, for example. In the dividing method making use of this laser processing technique, the workpiece is divided by applying a pulse laser beam at an infrared range capable of passing through the workpiece from one surface side of the workpiece with its focusing point set to the inside to continuously form a deteriorated layer in the inside of the workpiece along the dividing lines and exerting external force along the dividing lines whose strength has been reduced by the formation of the deteriorated layers.

As a means of dividing a wafer having deteriorated layers formed continuously along dividing lines into individual chips by exerting external force along the dividing lines of the wafer, the applicant of this application has proposed, in JP-A 2005-129607, a technology for dividing a wafer into individual chips along the dividing lines where the deteriorated layer has been formed by expanding a protective tape affixed to the wafer to give tensile force to the wafer.

However, in the method of giving tensile force to the wafer by expanding the protective tape affixed to the wafer, as when the protective tape affixed to the wafer is expanded, tensile force acts radially on the wafer and consequently, tensile force acts in a random direction on the dividing lines formed in a lattice pattern, whereby there occur problems that the wafer is divided irregularly and undivided areas remain. When a wafer having a test metal pattern called "test element group (TEG)" for testing the function of each circuit on the dividing lines is divided along the dividing lines by expanding the protective tape as described above, a problem may arise that irregular force acts on the above metal pattern, whereby the metal pattern is broken jaggedly, causes contamination and reduces the quality of each device.

To solve the above problems, the applicant has proposed in Japanese Patent Application No. 2004-215111, a wafer dividing apparatus comprising a tape holding means for holding a protective tape affixed to one surface side of a wafer, a first suction-holding member and a second suction-holding member, which suction-hold the wafer supported on the tape holding means through the protective tape on both sides of each dividing line through the protective tape, and a moving means for moving the first suction-holding member and the second suction-holding member in opposite directions from each other.

Since the wafer dividing apparatus proposed as Japanese Patent Application No. 2004-215111 is constituted such that dividing work is carried out one by one on each of a plurality of dividing lines formed on the wafer, it takes a considerable time for dividing the wafer along all the dividing lines. Therefore, the above wafer dividing apparatus is not satisfactory in terms of productivity.

SUMMARY OF THE INVENTION

It is an object of the present invention to provide a wafer dividing apparatus capable of dividing a wafer whose strength has been reduced along the dividing lines, along dividing lines precisely, surely and efficiently.

To attain the above object, according to the present invention, there is provided a wafer dividing apparatus for dividing a wafer whose strength is reduced along a plurality of dividing lines, along the dividing lines, comprising:

a tape holding means for holding a protective tape affixed to one surface side of the wafer; and wafer dividing means, each comprising a plurality of tension application means comprising a first suction-holding member and a second suction-holding member, which suction-hold the wafer held on the tape holding means through the protective tape on both sides of a dividing line through the protective tape, and moving means for moving the first suction-holding members and the second suction-holding members in such directions that they separate from each other.

The above plurality of tension application means are arranged in series in the moving direction of the moving means and have indexing means for moving the plurality of tension application means in the moving direction. The above second suction-holding members are movably mounted on the respective first suction-holding members, the above moving means move the second suction-holding members, and the above indexing means move the first suction-holding means. Preferably, two tension application means are arranged such that the above first suction-holding means are opposed to each other and the above second suction-holding members are constituted to be moved in outward directions of separating them from each other. Preferably, the wafer dividing apparatus has a detection means for detecting dividing lines of the wafer held on the above tape holding means through the protective tape. The above protective tape is mounted on an annular frame, and the above tape holding means comprises a frame holding means for supporting the annular frame.

In the present invention, the first suction-holding members and the second suction-holding members constituting the tension application means are positioned on both sides of respective dividing lines, the wafer is suction-held on the first suction-holding members and the second suction-holding members through the protective tape, and the first suction-holding members and the second suction-holding members are moved in directions of separating them from each other to exert tensile force in a direction perpendicular to the dividing lines. Consequently, the wafer can be divided precisely and surely along the dividing lines whose strength has been reduced. Therefore, even when a test metal pattern called "test element group (TEG)" for testing the function of each circuit is formed on the dividing lines, this metal pattern is also divided precisely along the dividing lines. Further, as the dividing apparatus of the present invention comprises a plurality of tension application means, the wafer can be divided along a plurality of dividing lines at the same time, thereby improving productivity.

DETAILED DESCRIPTION OF THE PREFERRED EMBODIMENT

A preferred embodiment of the wafer dividing apparatus of the present invention will be described in detail hereinunder with reference to the accompanying drawings.

Figure 1:
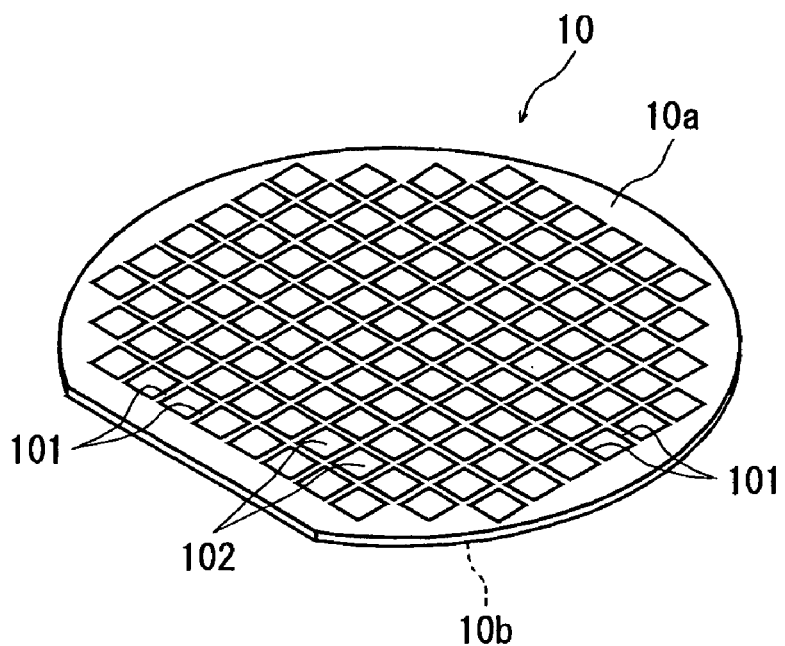
FIG. 1 is a perspective view of a semiconductor wafer to be divided by the wafer dividing apparatus constituted according to the present invention.

FIG. 1 is a perspective view of a semiconductor wafer as a wafer to be divided by the dividing apparatus constituted according to the present invention. The semiconductor wafer 10 shown in FIG. 1 is, for example, a silicon wafer having a thickness of 300 µm, and a plurality of dividing lines 101 are formed in a lattice pattern on the front surface 10a. On the front surface 10a of the semiconductor wafer 10, a circuit 102 as a function element is formed in each of a plurality of areas sectioned by the plurality of dividing lines 101.

To divide the above semiconductor wafer 10 along the dividing lines, a deteriorated layer forming processing for forming a deteriorated layer in the inside of the semiconductor wafer 10 along the dividing lines 101 by applying a pulse laser beam of a wavelength capable of passing through the semiconductor wafer 10 along the dividing lines 101 to cause to reduce the strength of the semiconductor wafer 10 along the dividing lines 101 is carried out. This deteriorated layer forming processing is carried out by using a laser beam processing machine 1 shown in FIGS. 2 to 4. The laser beam processing machine 1 shown in FIGS. 2 to 4 comprises a chuck table 11 for holding a workpiece, a laser beam application means 12 for applying a laser beam to the workpiece held on the chuck table 11, and an image pick-up means 13 for picking up an image of the workpiece held on the chuck table 11. The chuck table 11 is so constituted as to suction-hold the workpiece and is designed to be moved in a processing-feed direction indicated by an arrow X and an indexing-feed direction indicated by an arrow Y in FIG. 2 by a moving mechanism that is not shown.

Figure 3:
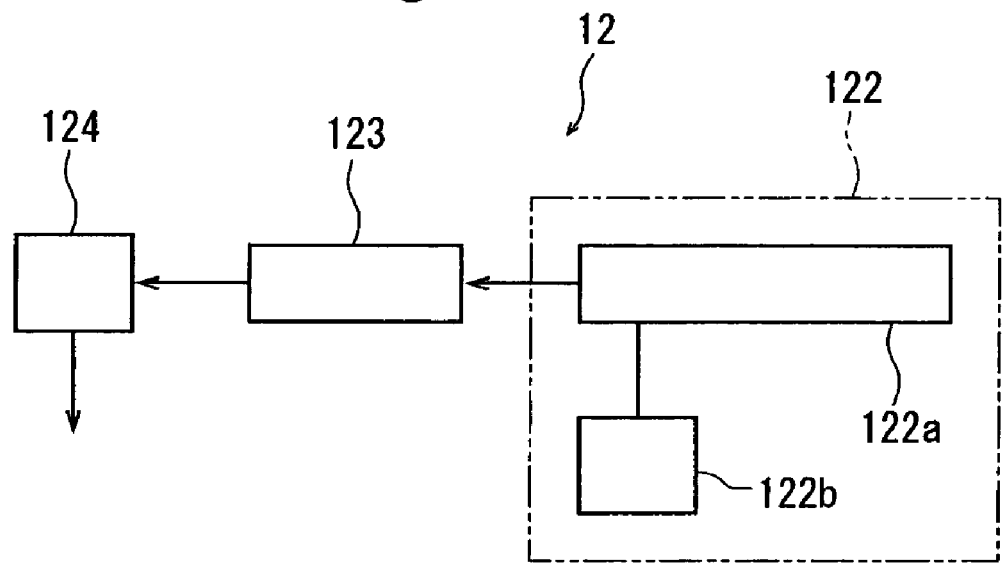
FIG. 3 is a block diagram schematically showing the constitution of laser beam application means provided in the laser beam processing machine shown in FIG. 2.
Figure 4:
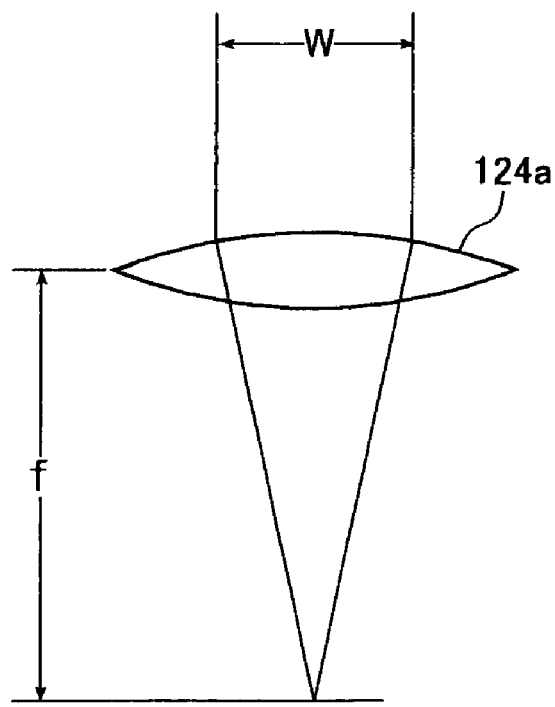
FIG. 4 is a schematic diagram showing the focusing spot diameter of a pulse laser beam.

The above laser beam application means 12 has a cylindrical casing 121 arranged substantially horizontally. In the casing 121, as shown in FIG. 3, there are installed a pulse laser beam oscillation means 122 and a transmission optical system 123. The pulse laser beam oscillation means 122 is constituted by a pulse laser beam oscillator 122a composed of a YAG laser oscillator or YVO4 laser oscillator and a repetition frequency setting means 122b connected to the pulse laser beam oscillator 122a. The transmission optical system 123 comprises suitable optical elements such as a beam splitter, etc. A condenser 124 housing condensing lenses (not shown) constituted by a set of lenses that may be formation known per se is attached to the end of the above casing 121. A laser beam oscillated from the above pulse laser beam oscillation means 122 reaches the condenser 124 through the transmission optical system 123 and is applied from the condenser 124 to the workpiece held on the above chuck table 11 at a predetermined focusing spot diameter D. This focusing spot diameter D is defined by the expression D (µm)=4×λ×f/(π×W) (wherein λ is the wavelength (µm) of the pulse laser beam, W is the diameter (mm) of the pulse laser beam applied to an objective lens 124a, and f is the focusing distance (mm) of the objective lens 124a) when the pulse laser beam showing a Gaussian distribution is applied through the objective lens 124a of the condenser 124 as shown in FIG. 4.

The image pick-up means 13 attached to the end of the casing 121 constituting the above laser beam application means 12 comprises an infrared illuminating means for applying infrared radiation to the workpiece, an optical system for capturing infrared radiation applied by the infrared illuminating means, and an image pick-up element (infrared CCD) for outputting an electric signal corresponding to infrared radiation captured by the optical system, in addition to an ordinary image pick-up element (CCD) for picking up an image with visible radiation in the illustrated embodiment. An image signal is transmitted to a control means which will be described later.

The deteriorated layer forming processing which is carried out by using the above laser beam processing machine 1 will be described with reference to FIG. 2, FIGS. 5(a) and 5(b), and FIG. 6.

Figure 2:
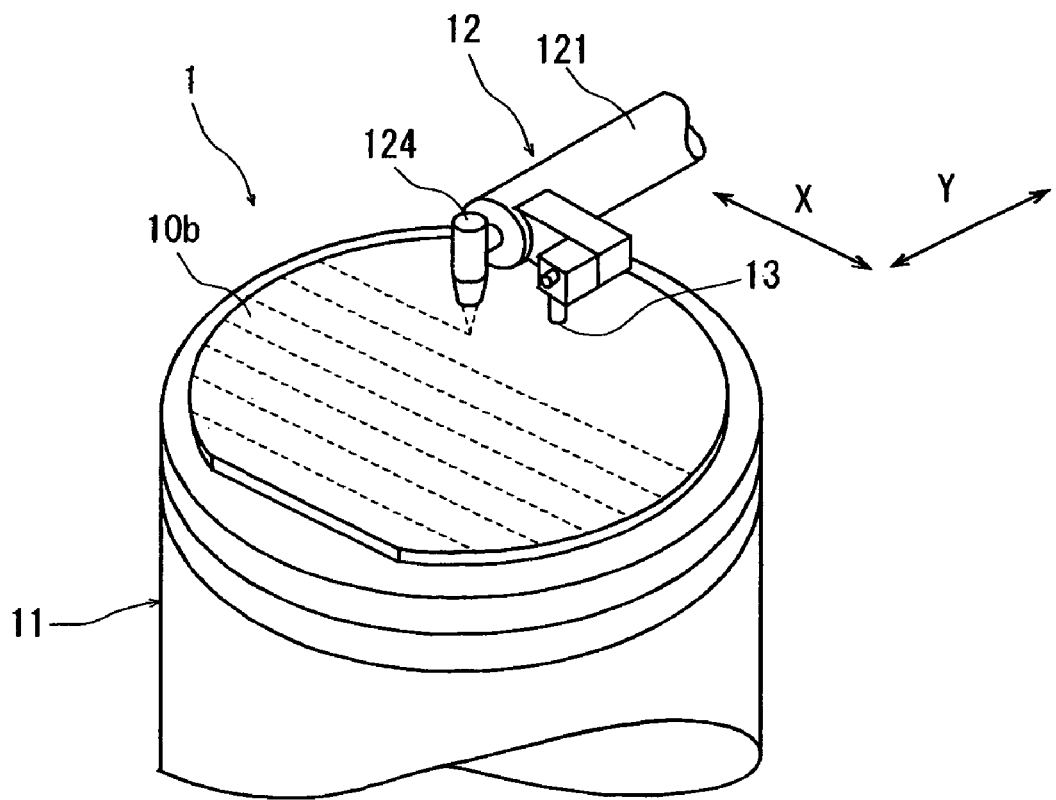
FIG. 2 is a perspective view of the principal section of a laser beam processing machine for forming a deteriorated layer in the semiconductor wafer shown in FIG. 1.

In this deteriorated layer forming processing, the semiconductor wafer 10 is first placed on the chuck table 11 of the laser beam processing machine 1 shown in FIG. 2 in such a manner that the back surface 10b faces up, and suction-held on the chuck table 11. The chuck table 11 suction-holding the semiconductor wafer 10 is brought to a position right below the image pick-up means 13 by a moving mechanism that is not shown.

After the chuck table 11 is positioned right below the image pick-up means 13, alignment work for detecting the area to be processed of the semiconductor wafer 10 is carried out by using the image pick-up means 13 and the control means that is not shown. That is, the image pick-up means 13 and the control means (not shown) carry out image processing such as pattern matching, etc. to align a dividing line 101 formed in a predetermined direction of the semiconductor wafer 10 with the condenser 124 of the laser beam application means 12 for applying a laser beam along the dividing line 101, thereby performing the alignment of a laser beam application position. The alignment of the laser beam application position is also carried out on dividing lines 101 formed on the semiconductor wafer 10 in a direction perpendicular to the predetermined direction. Although the front surface 10a having the dividing lines 101 formed thereon of the semiconductor wafer 10 faces down at this point, an image of the dividing line 101 can be taken through the back surface 10b as the image pick-up means 13 is constituted by the infrared illuminating means, an optical system for capturing infrared radiation and an image pick-up element (infrared CCD) for outputting an electric signal corresponding to the infrared radiation, as described above.

Figure 5:
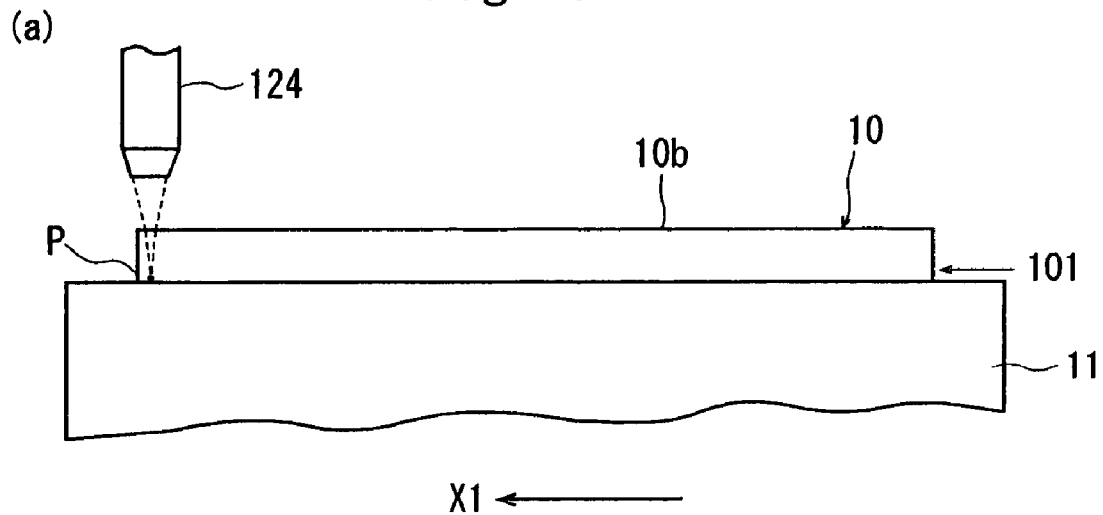
FIGS. 5(a) and 5(b) are explanatory diagrams showing a state where processing of forming a deteriorated layer is carried out along a dividing line of the semiconductor wafer by the laser beam processing machine shown in FIG. 2.

After the dividing line 101 formed on the semiconductor wafer 10 held on the chuck table 11 is detected and the alignment of the laser beam application position is carried out as described above, the chuck table 11 is moved to a laser beam application area where the condenser 124 of the laser beam application means 12 for applying a laser beam is located to bring one end (left end in FIG. 5(a)) of the predetermined dividing line 101 to a position right below the condenser 124 of the laser beam application means 12, as shown in FIG. 5(a). The chuck table 11, that is, the semiconductor wafer 10 is then moved in the direction indicated by the arrow X1 in FIG. 5(a) at a predetermined processing-feed rate while the pulse laser beam of a wavelength capable of passing through the semiconductor wafer 10 is applied from the condenser 124. When the application position of the condenser 124 of the laser beam application means 12 reaches the other end of the dividing line 101 as shown in FIG. 5(b), the application of the pulse laser beam is suspended and the movement of the chuck table 11, that is, the semiconductor wafer 10 is stopped. In this deteriorated layer forming processing, the focusing point P of the pulse laser beam is set to a position near the front surface 10a (undersurface) of the semiconductor wafer 10. As a result, a deteriorated layer 110 is exposed to the front surface 10a (undersurface) and is formed from the front surface 10a toward the inside. This deteriorated layer 110 is formed as a molten-resolidified layer (that is, as a layer that has been once molten and then re-solidified.) to be reduced in the strength.

The processing conditions in the above deteriorated layer forming processing are set as follows, for example.

Light source: LD excited Q switch Nd:YVO4 laser
Wavelength: pulse laser beam having a wavelength of 1,064 nm

| Pulse output: | 10 μJ |
|---|---|
| Focusing spot diameter: | 1 μm |
| Repetition frequency: | 100 kHz |
| Processing-feed rate: | 100 mm/sec |

Figure 6:
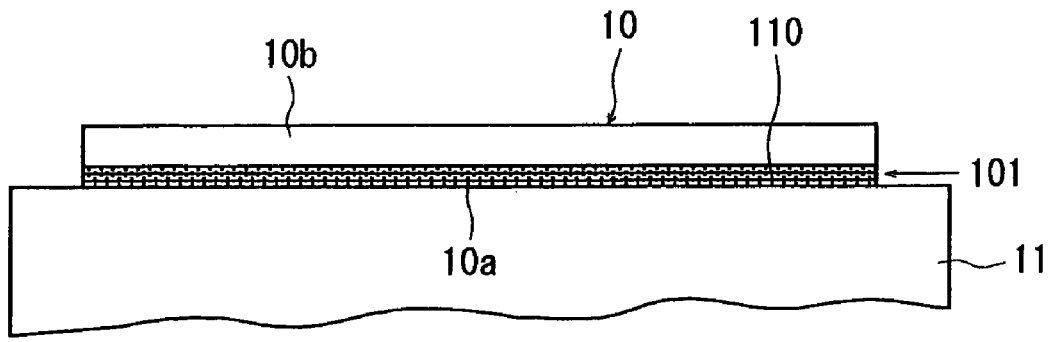
FIG. 6 is an explanatory diagram showing a state where deteriorated layers are laminated in the inside of the semiconductor wafer in the deteriorated layer forming processing shown in FIGS. 5(a) and 5(b)

When the semiconductor wafer 10 is thick, the above deteriorated layer forming processing is carried out a plurality of times by changing the focusing point P stepwise as shown in FIG. 6 to form a plurality of deteriorated layers 110. For example, since the thickness of the deteriorated layer formed one time under the above processing conditions is about 50 μm, the above deteriorated layer forming processing is carried out three times to form deteriorated layers 110 having a total thickness of 150 μm. In the case of a wafer 10 having a thickness of 300 μm, six deteriorated layers extending from the front surface 10a to the back surface 10b may be formed in the inside of the wafer 10 along the dividing lines 101. Alternatively, the deteriorated layers 110 may be formed only in the inside of the semiconductor wafer 10 without being exposed to the front surface 10a and the back surface 10b.

Figure 7:
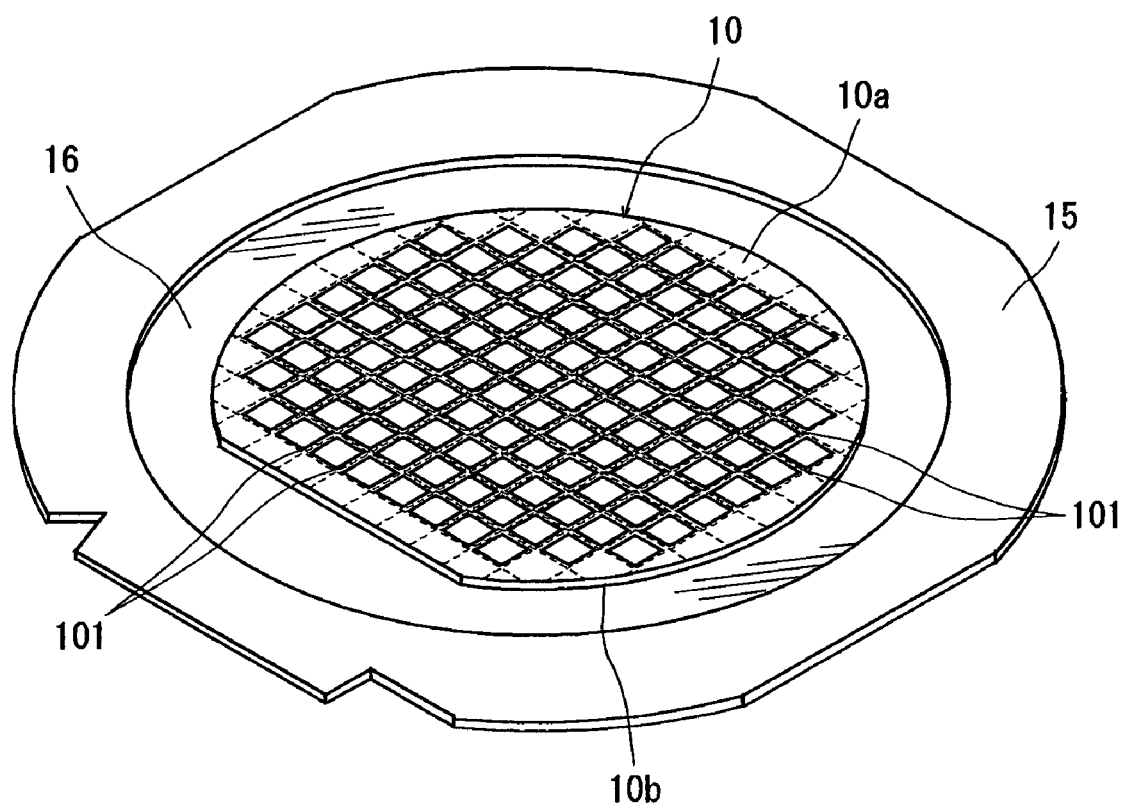
FIG. 7 is a perspective view showing a state where the semiconductor wafer which has undergone the deteriorated layer forming processing is put on the surface of a protective tape mounted on an annular frame.

After the deteriorated layer 110 is formed in the inside of the semiconductor wafer 10 along all the dividing lines 101 by the above-described deteriorated layer forming processing, the back surface 10b of the semiconductor wafer 10 is put on the surface of a protective tape 16 whose outer peripheral portion is so mounted on an annular frame 15 as to cover its inner opening, as shown in FIG. 7. In the illustrated embodiment, an about 5 μm-thick acrylic resin-based adhesive is coated on the surface of a 70 μm-thick sheet backing made of polyvinyl chloride (PVC), of the above protective tape 16. The semiconductor wafer 10 may be put on the protective tape 16 before the above deteriorated layer formation processing is carried out. That is, the front surface 10a of the semiconductor wafer 10 is put on the protective tape 16 in such a manner that the back surface 10b faces up, and the deteriorated layer formation processing is carried out in a state where the semiconductor wafer 10 is supported on the annular frame 15.

A description will be subsequently given of a dividing apparatus for dividing along the dividing lines 101 the semiconductor wafer 10 whose strength has been reduced by the formation of the deteriorated layers 110 along the dividing lines 110 as described above, with reference to FIG. 8 and FIG. 9.

Figure 8:
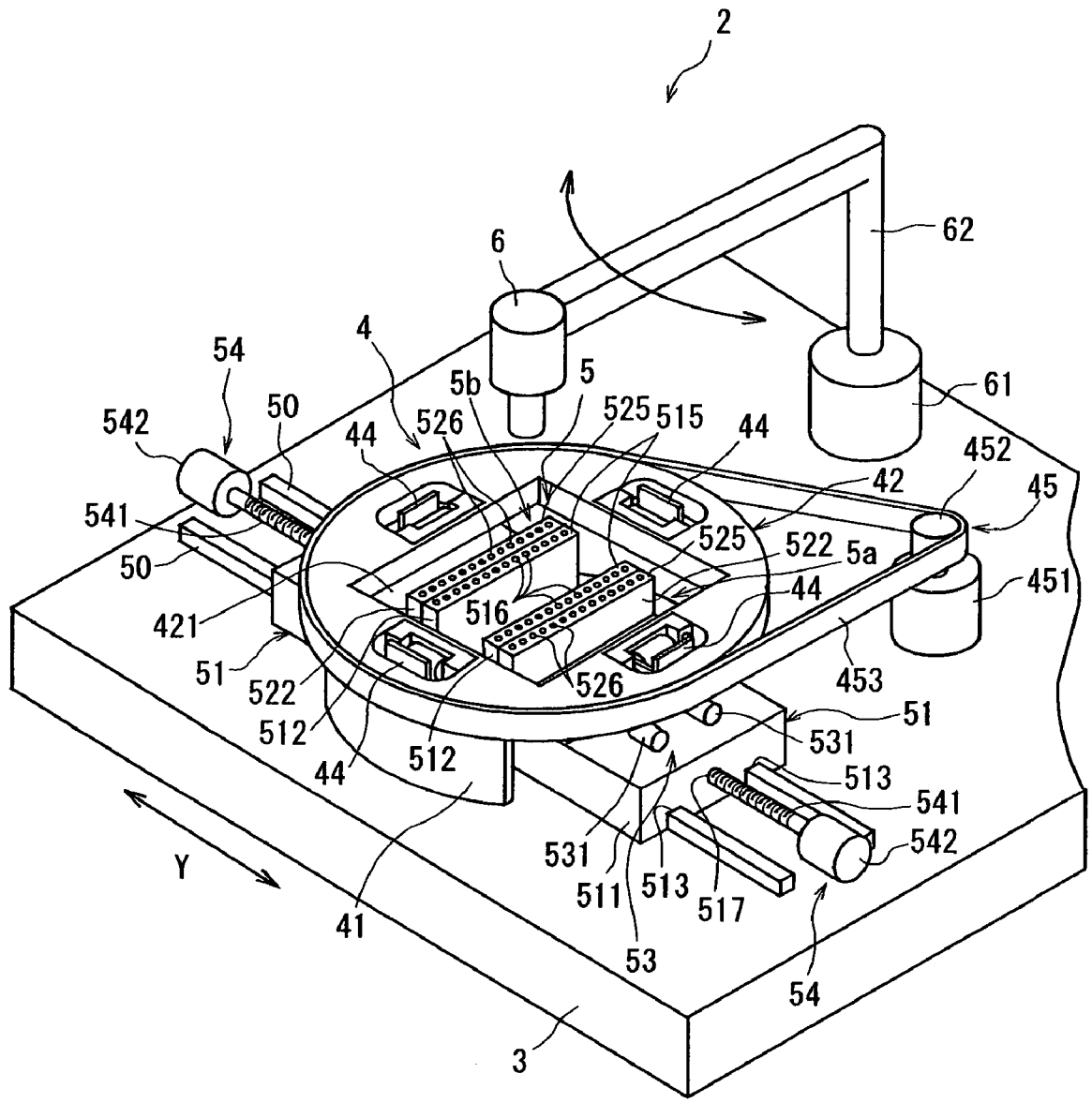
FIG. 8 is a perspective view of a wafer dividing apparatus constituted according to the present invention.
Figure 9:
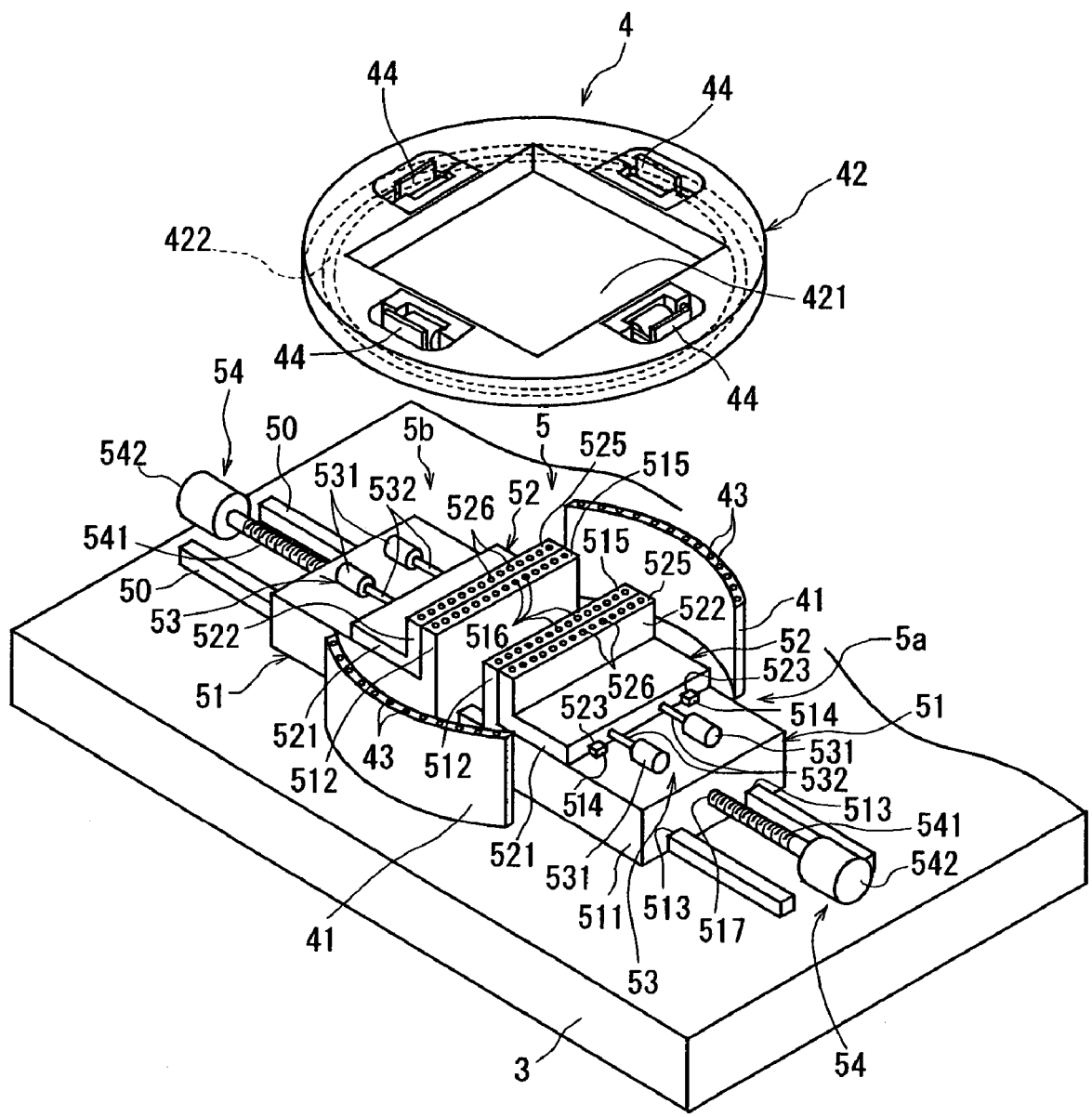
FIG. 9 is an exploded perspective view of the principal section of the wafer dividing apparatus shown in FIG. 8.

FIG. 8 is a perspective view of a wafer dividing apparatus constituted according to the present invention, and FIG. 9 is an exploded perspective view of the principal section of the dividing apparatus shown in FIG. 8. The dividing apparatus 2 in the illustrated embodiment comprises a base 3, a frame holding means 4 that is installed on the base 3 and holds the annular frame 15 shown in FIG. 7, and wafer dividing means 5 for dividing the semiconductor wafer 10 supported onto the annular frame 15 held on the frame holding means 4 through the protective tape 16, along the dividing lines 101.

The frame holding means 4 comprises a pair of support members 41 and 41 and a holding table 42 that is to be mounted on the pair of support members 41 and 41. The pair of support members 41 and 41 are arcuate with a predetermined curvature radius and are so arranged as to be opposed to each other with a predetermined space therebetween. The top surfaces of the pair of support members 41 and 41 have respectively a plurality of ball bearings 43. The holding table 42 is formed in a disk-like shape, and has a rectangular opening 421 at the center. On the upper surface of the holding table 42, four clamps 44 are arranged at positions where they are opposed to each other with the opening 421 therebetween. An annular to-be-guided groove 422 having the same radius as the curvature radius of the above pair of support members 41 and 41 is formed in the undersurface of the holding table 42. The thus constituted holding table 42 is supported by the ball bearings 43 when the annular to-be-guided groove 422 is fitted into the top end portions of the pair of support members 41 and 41. Therefore, the holding table 42 is supported such that it can turn along the curvatures of the pair of support members 41 and 41. The above annular frame 15 is supported by the thus constituted frame holding means 4. That is, the annular frame 15 supporting the semiconductor wafer 10 through the protective tape 16 as shown in FIG. 7 is placed on the holding table 42, and the annular frame 15 placed on the holding table 42 is fixed by the clamps 44. Therefore, the frame holding means 4 serves as a tape supporting means for supporting the protective tape 16 affixed to the above semiconductor wafer 10 through the annular frame 15.

The wafer dividing apparatus 2 in the illustrated embodiment comprises a turning means 45 for turning the above holding table 42 as shown in FIG. 8. This turning means 45 comprises a pulse motor 451 mounted on the above base 2, a pulley 452 connected to the rotary shaft of the pulse motor 451, and an endless belt 453 wound round the pulley 452 and an outer peripheral surface of the holding table 42. The thus constituted turning means 45 turns the holding table 42 via the pulley 452 and the endless belt 453 by driving the pulse motor 451.

A description will be subsequently given of the above wafer dividing means 5.

The wafer dividing means 5 in the illustrated embodiment comprises a pair of guide rails 50 and 50, which are mounted on the base 3 between the pair of support members 41 and 41 of the above frame holding means 4 and extend in the direction indicated by the arrow Y, and a first tension application means 5a and a second tension application means 5b which are arranged on the pair of guide rails 50 and 50 in series. The pair of guide rails 50 and 50 are parallel to each other with a predetermined space therebetween. The first tension application means 5a and the second tension application means 5b are arranged to be opposed to each other on the pair of guide rails 50 and 50 and are so constituted as to be moved along the pair of guide rails 50 and 50. The first tension application means 5a and the second tension application means 5b are substantially the same in constitution and therefore, the same members are given the same reference symbols.

The first tension application means 5a and the second tension application means 5b are each provided with a first suction-holding member 51 and a second suction-holding member 52. The first suction-holding member 51 is formed in an L-shape, and consists of a rectangular first support portion 511 and a first holding portion 512 extending upward from one end of the first support portion 511. A pair of to-be-guided grooves 513 and 513 corresponding to the pair of guide rails 50 and 50 are formed on the undersurface of the first support portion 511 constituting the first suction-holding member 51. By fitting the pair of to-be-guided grooves 513 and 513 into the pair of guide rails 50 and 50, the first suction-holding member 51 is supported movably along the pair of guide rails 50 and 50. A pair of guide rails 514 and 514 extending in the direction indicated by the arrow Y are mounted on upper surface of the first support portion 511 constituting the first suction-holding member 51. The first holding portion 512 constituting the first suction-holding member 51 has an elongated rectangular first holding surface 515, which is arranged within the opening 421 of the above holding table 42 and, at the upper end, extends in a direction perpendicular to the above Y direction. The first holding surface 515 has substantially the same length as the diameter of the above semiconductor wafer and is positioned substantially at the same height as the upper surface of the above holding table 42. A plurality of suction holes 516 are formed in the first holding surface 515 of the first holding portion 512. The plurality of suction holes 516 are communicated with a suction means that is not shown. Therefore, when the suction means (not shown) is activated, negative pressure acts on the plurality of suction holes 516 to suction-hold the semiconductor wafer 10 on the first holding surface 515 through the above protective tape 16.

A description will be subsequently given of the second suction-holding member 52.

The second suction-holding member 52 is formed in an L-shape, and consists of a rectangular second support portion 521 and a second holding portion 522 extending upward from one end of the second support portion 521. A pair of to-be-guided grooves 523 and 523 corresponding to the pair of guide rails 514 and 514 provided on the first support portion 511 constituting the above first suction-holding member 51 are formed in the undersurface of the second support portion 521 constituting the second suction-holding member 52. By fitting the pair of to-be-guided grooves 523 and 523 into the pair of guide rails 514 and 514, the second suction-holding member 52 is supported movably along the pair of guide rails 514 and 514. The second holding portion 522 constituting the second suction-holding member 52 has an elongated rectangular second holding surface 525, which is arranged within the opening 421 of the above holding table 42 and, at the upper end, extends in a direction perpendicular to the above Y direction. This second holding surface 525 has the same length as the above first holding surface 515, that is, substantially the same length as the diameter of the above semiconductor wafer and is positioned substantially at the same height as the upper surface of the above holding table 42. A plurality of suction holes 526 are formed in the second holding surface 525 of the second holding portion 522. The plurality of suction holes 526 are communicated with a suction means that is not shown. Therefore, when the suction means (not shown) is activated, negative pressure acts on the plurality of suction holes 526 to suction-hold the semiconductor wafer 10 on the second holding surface 525 through the above protective tape 16.

In the illustrated embodiment, the above first tension application means 5a and the above second tension application means 5b are arranged such that the first holding portions 512 of the first suction-holding members 51 are arranged to be opposed to each other. Therefore, the second suction-holding members 52 and 52 mounted on the first suction-holding members 51 and 51 are designed to separate from the first suction-holding members 51 and 51 when they move respectively outward in opposite directions.

The first tension application means 5a and the second tension application means 5b in the illustrated embodiment have moving means 53 for moving the respective second suction-holding members 52 and 52 along the above pair of guide rails 514 and 514 in the direction indicated by the arrow Y. Each of the moving means 53 consists of two air cylinders 531 and 531 mounted on the first support portion 511 of the first suction-holding member 51 as shown in FIG. 9, and their piston rods 532 and 532 are connected to the second support portion 521 of the second suction-holding member 52. The air cylinders 531 and 531 move the second suction-holding member 52 by about 0.5 to 2 mm in a direction that it separates from the first suction-holding member 51 by supplying compressed air to one of working chambers (not shown) and move the second suction-holding member 52 in a direction that it approaches the first suction-holding member 51 by supplying compressed air to the other working chamber that is not shown.

The first tension application means 5a and the second tension application means 5b in the illustrated embodiment have indexing means 54 for moving the respective first suction-holding members 51 along the pair of guide rails 50 and 50 in the direction indicated by the arrow Y. Each of the indexing means 54 comprises a male screw rod 541 arranged parallel to the pair of guide rails 50 and 50, a pulse motor 542 that is connected to one end of the male screw rod 541 and rotary-drives the male screw rod 541, and a bearing 543 (see FIG. 10) that is mounted on the base 3 and rotatably supports the other end of the male screw rod 541, as shown in FIG. 9. The male screw rod 431 is screwed into threaded holes 517 formed in the first support portions 511 constituting the first suction-holding members 51. Therefore, by driving the pulse motor 542 in a normal direction or reverse direction, the first suction-holding members 51 can be moved along the pair of guide rails 50 and 50 in the direction indicated by the arrow Y.

Returning to FIG. 8, the wafer dividing apparatus 2 in the illustrated embodiment has a detection means 6 for detecting a dividing line 101 of the semiconductor wafer 10 supported on the annular frame 15 shown in FIG. 7 held on the holding table 42 constituting the above frame holding means 4 through the protective tape 16. The detection means 6 is attached to an L-shaped pole 62 connected to a turning mechanism 61 installed on the base 3. This detection means 6 is composed of an optical system and an image pick-up element (CCD), and is located above the frame holding means 4. The thus constituted detection means 6 picks up an image of a dividing line 101 of the semiconductor wafer 10 supported on the annular frame 15 held on the above holding table 42 through the protective tape 16, converts it into an electric signal and supplies the electric signal to the control means that is not shown. The L-shaped pole 62 supporting the detection means 6 is swung in the direction indicated by the arrow by the turning mechanism 61.

The wafer dividing apparatus 2 in the illustrated embodiment is constituted as described above, and its operation will be described hereinunder with reference mainly to FIG. 8, FIG. 10, and FIGS. 11(a) and 11(b).

Figure 10:
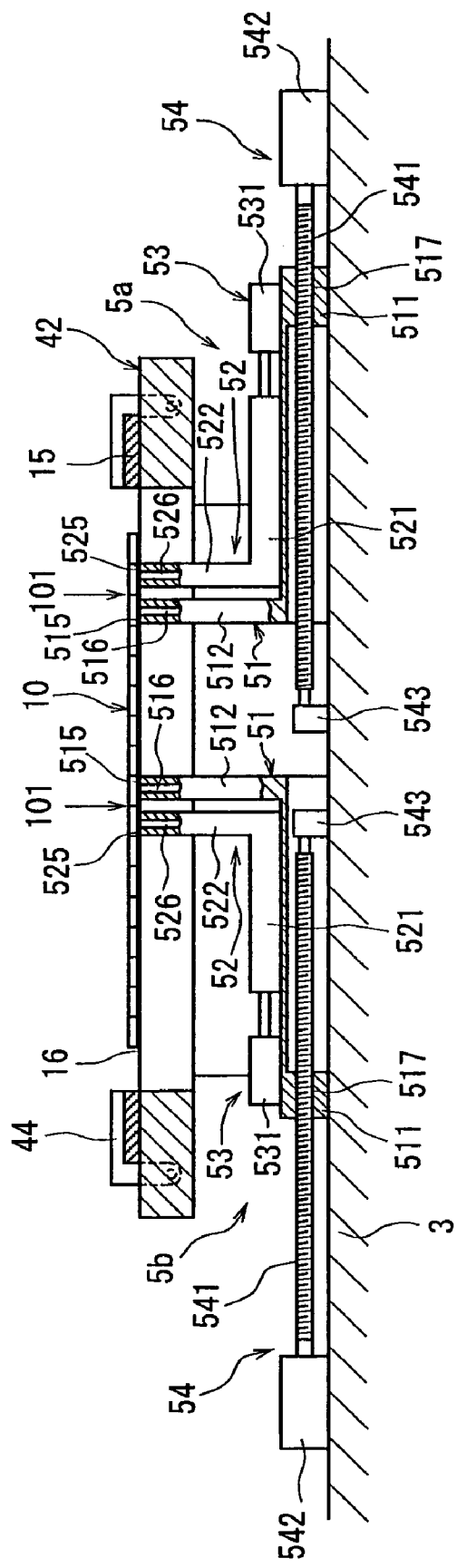
FIG. 10 is a sectional view of the principal section showing a state where the annular frame holding the semiconductor wafer through a protective tape is supported on the frame holding means constituting the wafer dividing apparatus shown in FIG. 8.

The annular frame 15 supporting the semiconductor wafer 10, whose strength has been reduced along the dividing lines 101, through the protective tape 16 as shown in FIG. 7 is placed on the upper surface of the holding table 42 constituting the frame holding means 4 and fixed on the holding table 42 by the clamps 44, as shown in FIG. 10.

After the annular frame 15 supporting the semiconductor wafer 10 through the protective tape 16 is held on the frame holding means 4, as shown in FIG. 10, the indexing means 54 of the first tension application means 5a is activated to bring the first suction-holding member 51 and the second suction-holding member 52 of the first tension application means 5a to a position corresponding to the most right dividing line 101 in FIG. 10 formed on the semiconductor wafer 10 in a predetermined direction, and the indexing means 54 of the second tension application means 5b is also activated to bring the first suction-holding member 51 and the second suction-holding member 52 of the second tension application means 5b to a position corresponding to a central dividing line 101 in FIG. 10 formed on the semiconductor wafer 10 in the predetermined direction. Thereafter, the first holding surfaces 515 of the first holding portions 512 constituting the first suction-holding members 51 and the second holding surfaces 525 of the second holding portions 522 constituting the second suction-holding members 52 in the first tension application means 5a and the second tension application means 5b are positioned on both sides of the respective dividing lines 101. At this point, images of the dividing lines 101 are picked up by the detection means 6, and their positions are aligned with the first holding surfaces 515 and the second holding surfaces 525, respectively.

After the first suction-holding members 51 and the second suction-holding members 52 of the first tension application means 5a and the second tension applicant means 5b are respectively positioned at locations shown in FIG. 10, the suction means (not shown) communicated with the suction holes 516 and 526 formed each in the first suction-holding member 51 and the second suction-holding member 52 are activated. As a result, negative pressure acts on the suction holes 516 and 526 as shown in FIG. 11(a) so that the semiconductor wafer 10 is suction-held on the first holding surfaces 515 of the first holding portions 512 and the second holding surfaces 525 of the second holding portions 522 through the protective tape 16 (holding step).

Figure 11:
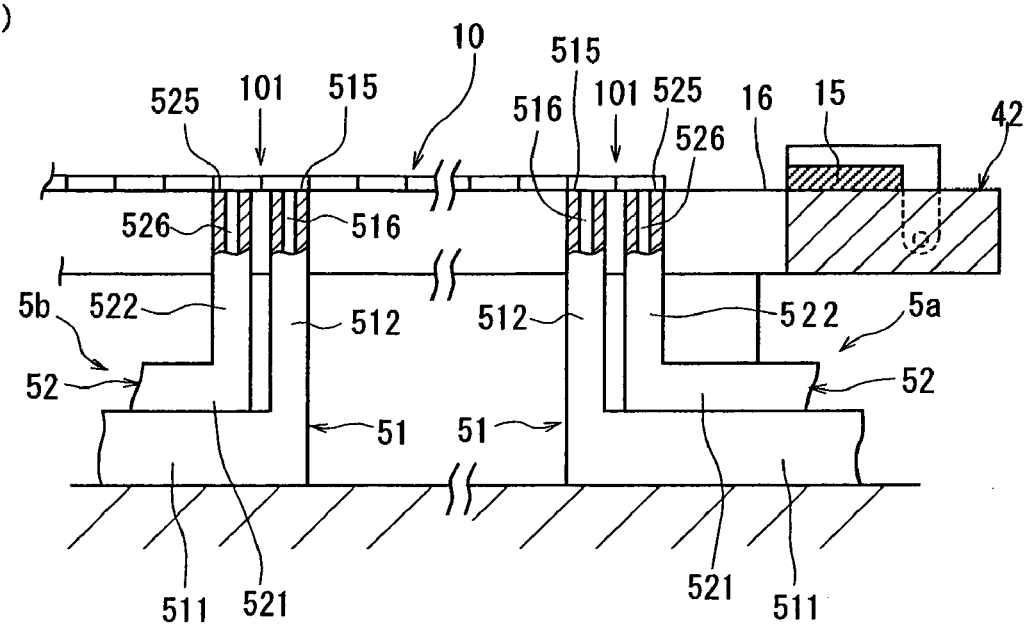
FIGS. 11(a) and 11(b) are explanatory diagrams showing the step of dividing the semiconductor wafer along dividing lines by the dividing apparatus shown in FIG. 8.
Figure 11:
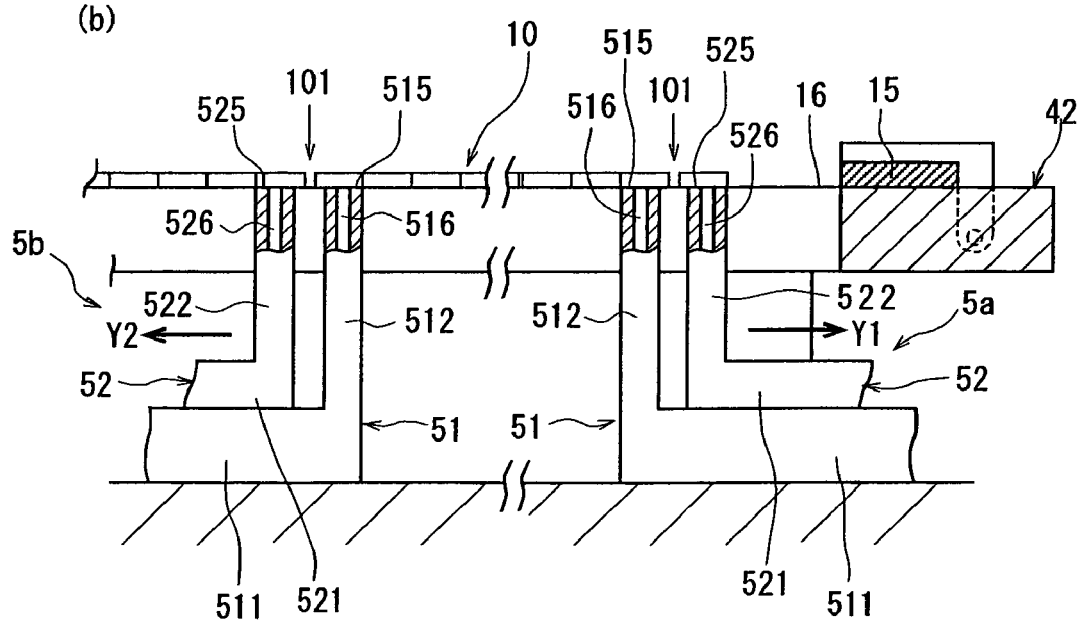

Thereafter, the air cylinders 531 constituting the moving means 53 of the first tension application means 5a and the second tension application means 5b are activated to move the second suction-holding member 52 of the first tension application means 5a in the direction indicated by the arrow Y1 and to move the second suction-holding member 52 of the second tension application means 5b in the direction indicated by the arrow Y2, respectively, as shown in FIG. 11(b). That is, the second suction-holding members 52 of the first tension application means 5a and the second tension application means 5b are moved outwards in directions that they separate from the first suction-holding members 51. As a result, as shown in FIG. 11(b), tensile force acts on the dividing lines 101 positioned between the first holding surfaces 515 of the first suction-holding members 51 and the second holding surfaces 525 of the second suction-holding portions 52 in a direction perpendicular to the dividing lines 101 to divide the semiconductor wafer 10 along the dividing lines 101 (dividing step). In this dividing step, as the strength of the semiconductor wafer 10 has been reduced by the formation of the deteriorated layer 110 along the dividing lines 101, the semiconductor wafer 10 can be divided along the dividing lines 101 by moving the second suction-holding members 52 by about 0.5 mm in directions that they separate from the first suction-holding members 51.

In the illustrated embodiment, the semiconductor wafer 10 is suction-held by the first suction-holding members 51 and the second suction-holding members 52 positioned on both sides of the dividing lines 101 through the protective tape 16, and the second suction-holding members 52 are moved in directions that they separate from the first suction-holding members 51 to exert tensile force in a direction perpendicular to the dividing lines 101, there by making it possible to divide the semiconductor wafer 10 precisely and surely along the dividing lines 101 where the deteriorated layer 110 has been formed. Therefore, even when a test metal pattern called "test element group (TEG)" for testing the function of each circuit is formed on the dividing lines 101, this metal pattern can be also divided along the dividing lines accurately. Further, since in the illustrated embodiment, the dividing apparatus comprises the first tension application means 5a and the second tension application means 5b, the semiconductor wafer 10 can be divided along two dividing lines 101 at the same time, thereby improving productivity. Further, in the illustrated embodiment, as the second suction-holding members 52 of the first tension application means 5a and the second tension application means 5b are so constituted as to be moved in outward directions that they separate from the first suction-holding members 51 in the above dividing step, compressive force does not act on the wafer of an area between the first suction-holding members 51 of the first tension application means 5a and the second tension application means 5b, thereby eliminating damage to the wafer.

After the dividing step for dividing the semiconductor wafer 10 along two dividing lines 101 formed in the predetermined direction as described above, the suction-holding of the semiconductor wafer 10 by the first suction-holding members 51 and the second suction-holding members 52 of the first tension application means 5a and the second tension application means 5b is canceled. Thereafter, the indexing means 54 of the first tension application means 5a and the indexing means 54 of the second tension application means 5b are activated to move the first suction-holding members 51 and the second suction-holding members 52 by a distance corresponding to the interval between the dividing lines 101 leftwards in FIG. 10 respectively to bring them to positions corresponding to adjacent dividing lines 101 on the left side in FIG. 10 of the dividing lines 101, which have been subjected to the above dividing step. Then, the above holding step and the dividing step are carried out.

After the above holding step and the dividing step are carried out on all the dividing lines 101 formed in the predetermined direction, the turning means 45 is activated to turn the holding table 42 of the frame holding means 4 at 90°. As a result, the semiconductor wafer 10 held on the holding table 42 of the frame holding means 4 is also turned at 90°, so that dividing lines 101 formed in a direction perpendicular to the dividing lines 101 which have been formed in the predetermined direction and subjected to the above dividing step are positioned in parallel to the first holding surfaces 515 of the first suction-holding members 51 and the second holding surfaces 525 of the second suction-holding members 52 in the first tension application means 5a and the second tension application means 5b. Then, the above-described holding step and dividing step are carried out on all the dividing lines 101 formed in the direction perpendicular to the dividing lines 101 which have been subjected to the above dividing step, whereby the semiconductor wafer 10 is divided into individual semiconductor chips along the dividing lines 101.

While the present invention has been described above by way of a preferred embodiment with reference to the accompanying drawings, it should be noted that the present invention is in no way limited to the above embodiment only but can be changed or modified in other various ways within the scope of the present invention. For example, in the illustrated embodiment, the first holding surfaces 515 of the first suction-holding members 51 and the second holding surfaces 525 of the second suction-holding members 52 of the first tension application means 5a and the second tension application means 5b are both formed on horizontal level. However, the first holding surfaces 515 and the second holding surfaces 525 may be inclined such that they descend or ascend toward their opposed side edges. The angles formed by the first holding surfaces 515 and the second holding surfaces 525 are suitably 175° to 185°.

What is claimed is:

1. A wafer dividing apparatus for dividing a wafer whose strength is reduced along a plurality of dividing lines, along the dividing lines, comprising:
    a tape holding means for holding a protective tape affixed to one surface side of the wafer; and
    wafer dividing means, each comprising a plurality of tension application means comprising a first suction-holding member and a second suction-holding member for suction-holding the wafer held on the tape holding means through the protective tape on both sides of a dividing line through the protective tape, and moving means for moving the first suction-holding members and the second suction-holding members in such directions that they separate from each other.

2. The wafer dividing apparatus according to claim 1, wherein the plurality of tension application means are arranged in series in the moving direction of the moving means and have indexing means for moving the plurality of tension application means in the moving direction respectively.

3. The wafer dividing apparatus according to claim 2, wherein the second suction-holding members are movably mounted on the respective first suction-holding members, the moving means move the second suction-holding members, and the indexing means move the first suction-holding means.

4. The wafer dividing apparatus according to claim 3, wherein two tension application means are arranged such that the first suction-holding means are opposed to each other and the second suction-holding members are constituted to be moved in outward directions of separating them from each other.

5. The wafer dividing apparatus according to clam 1, which has a detection means for detecting dividing lines of the wafer held on the tape holding means through the protective tape.

6. The wafer dividing apparatus according to claim 1, wherein the protective tape is mounted on an annular frame, and the tape holding means comprises a frame holding means for supporting the annular frame.

* * * * *